United States Patent [19]
Clayton

[11] Patent Number: 5,661,339
[45] Date of Patent: Aug. 26, 1997

[54] THIN MULTICHIP MODULE

[76] Inventor: James E. Clayton, 10605 Marbury Ct., Austin, Tex. 78726-1312

[21] Appl. No.: 273,969

[22] Filed: Jul. 11, 1994

Related U.S. Application Data

[63] Continuation of Ser. No. 947,293, Sep. 16, 1992, abandoned.

[51] Int. Cl.⁶ .................... H01L 23/02; H01L 23/495; H01L 23/12; H01L 23/34
[52] U.S. Cl. .................. 257/678; 257/668; 257/701; 257/704; 257/712; 257/723; 257/729; 257/773; 257/787; 361/728
[58] Field of Search .................. 357/74, 70, 75; 257/782, 686, 712, 723, 724, 731, 729, 668, 701, 704, 678, 773, 785, 687, 787; 361/392, 393, 394, 395, 380, 417, 420, 388, 412; 174/35 R; 365/52

[56] References Cited

U.S. PATENT DOCUMENTS

| | | | |
|---|---|---|---|
| 3,372,310 | 3/1968 | Kantor | 257/724 |
| 3,704,455 | 11/1972 | Scarbrough | 361/412 |
| 4,169,642 | 10/1979 | Mouissies | 361/398 |
| 4,342,069 | 7/1982 | Link | 257/723 |
| 4,656,605 | 4/1987 | Clayton | 365/52 |
| 4,672,421 | 6/1987 | Lin | 257/778 |
| 4,682,207 | 7/1987 | Akasaki et al. | 257/724 |
| 4,727,513 | 2/1988 | Clayton | 365/52 |
| 4,850,892 | 7/1989 | Clayton et al. | 439/326 |
| 4,992,849 | 2/1991 | Corbert et al. | 257/678 |
| 4,992,850 | 2/1991 | Corbett et al. | 257/678 |
| 5,014,115 | 5/1991 | Moser | 257/678 |
| 5,014,161 | 5/1991 | Lef et al. | 361/388 |
| 5,025,306 | 6/1991 | Johnson et al. | 257/678 |
| 5,053,853 | 10/1991 | Haj-Ali-Ahmadi et al. | 257/693 |
| 5,109,318 | 4/1992 | Funari et al. | 257/718 |
| 5,140,405 | 8/1992 | King et al. | 257/678 |
| 5,224,023 | 6/1993 | Smith et al. | 340/173 |
| 5,400,003 | 3/1995 | Kledzik | 333/247 |

FOREIGN PATENT DOCUMENTS

| | | | |
|---|---|---|---|
| 53-085159 | 5/1977 | Japan | 257/668 |
| 3102862 | 4/1991 | Japan | 257/723 |
| 2130025 | 5/1984 | United Kingdom | 365/52 |

OTHER PUBLICATIONS

INSPEC, Electronic Design, vol. 24, No. 1, p. 120 5 Jan. 76 Expand a System's Memory Capacity w/o Mounting Hardware and BD Space.

*Primary Examiner*—Mahshid Saadat
*Assistant Examiner*—T. M. Arroyo
*Attorney, Agent, or Firm*—Akin, Gump, Strauss, Hauer & Feld, L.L.P.

[57] ABSTRACT

An improved semiconductor module comprising a molded frame and a composite semiconductor substrate subassembly received in a cavity in said frame. The composite semiconductor substrate subassembly comprises a plurality of semiconductor devices which are connected to electrical contacts on an edge of the molded frame by a variety of configurations described herein. In one embodiment of the invention, the composite semiconductor substrate subassembly includes a composite substrate which comprises a thin metal cover plate and thin laminate circuit which is bonded to the metal cover plate by a film adhesive. The composite substrate provides a mounting surface for the placement of semiconductor devices and their associated passive components. In some of the embodiments disclosed herein, the composite semiconductor substrate subassembly, comprising a cover plate with the composite substrate attached thereto, is attached to the molded frame by a rectangular ring formed from an anisotropic, electrically conductive adhesive material. The composite substrate employed in the present invention offers the advantage of allowing the components to be pre-assembled, tested and repaired prior to final attachment into the molded frame.

37 Claims, 12 Drawing Sheets

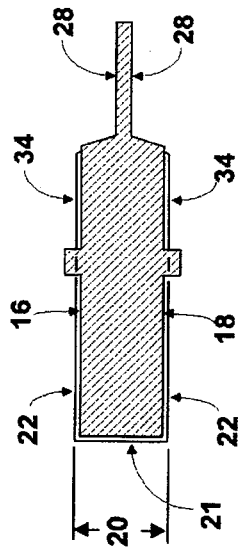
*Figure 2A*
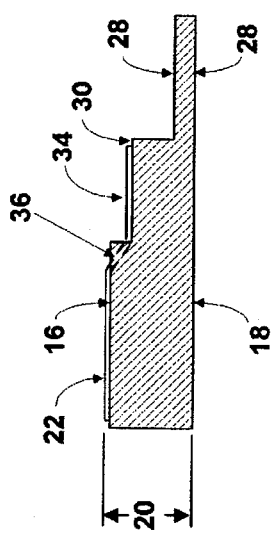
*Figure 2B*
*Figure 2*
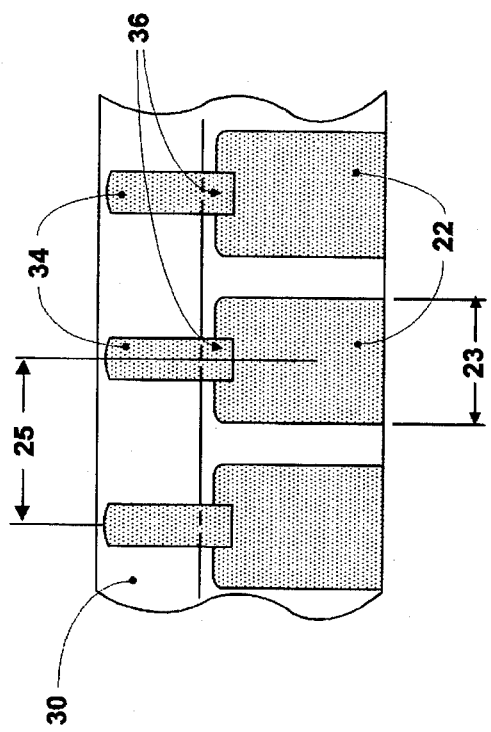
*Figure 3*

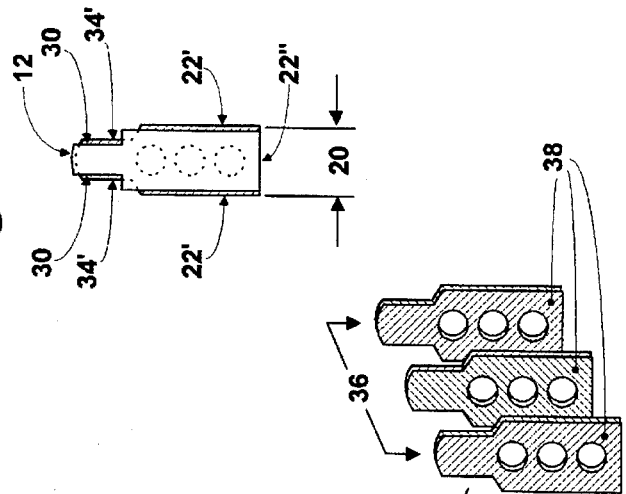
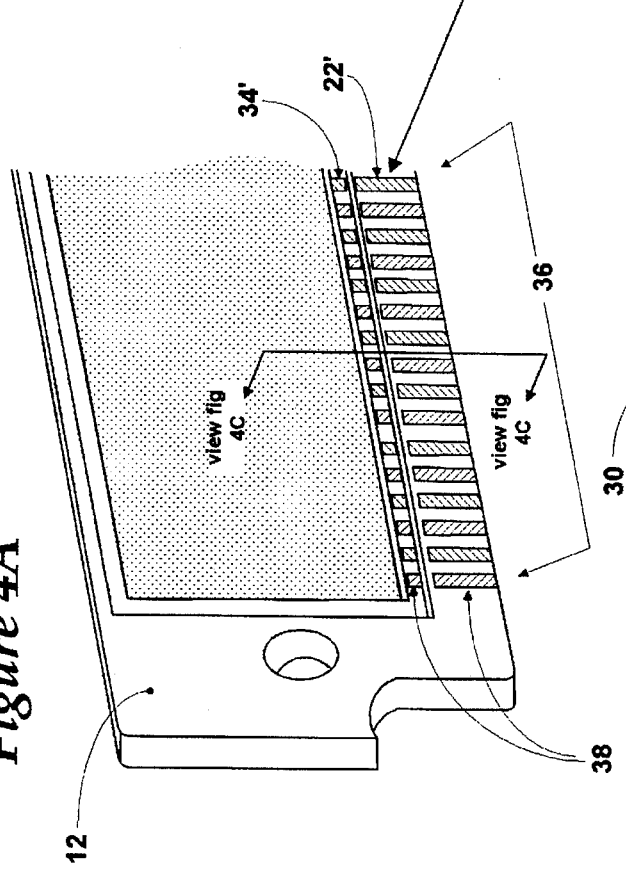
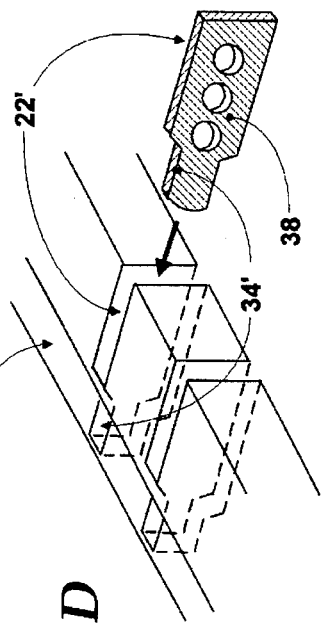

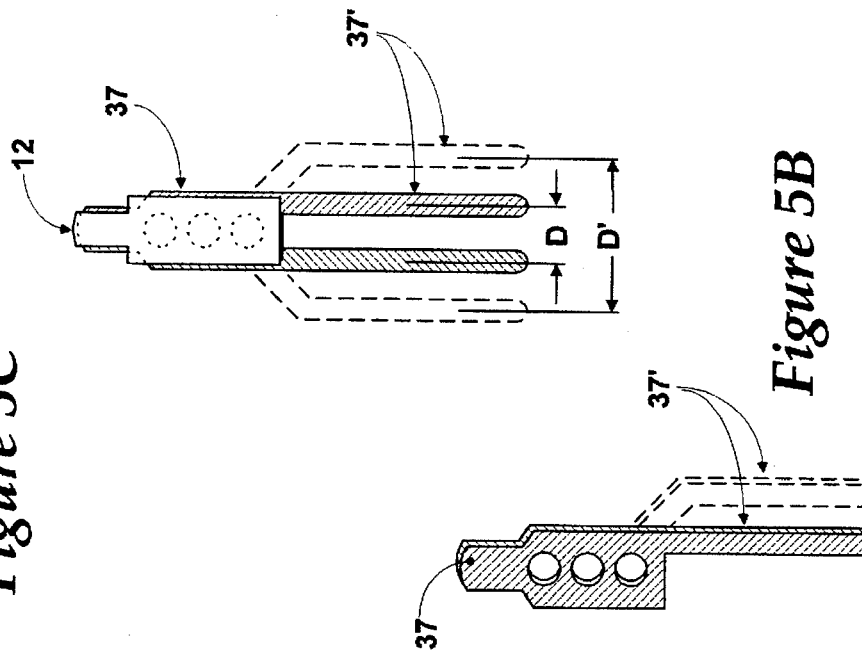
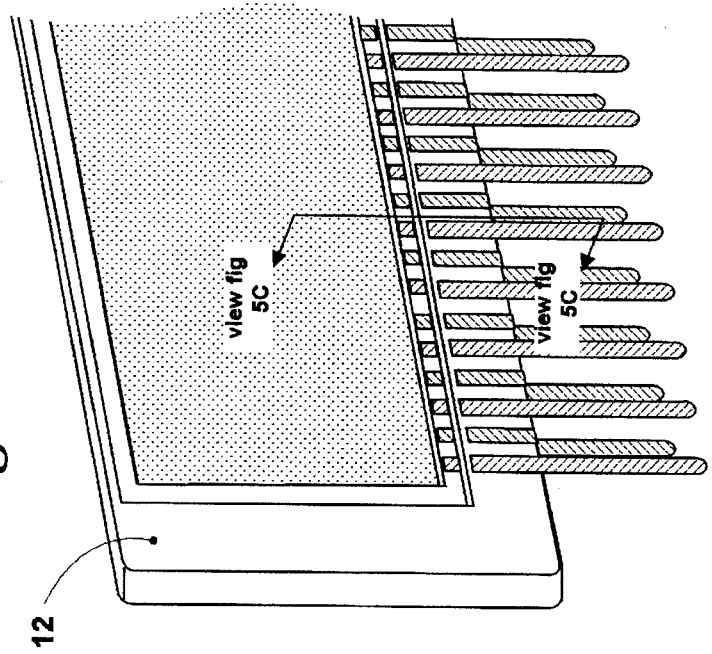
*Figure 5A*  *Figure 5B*  *Figure 5C*
*Figure 5*

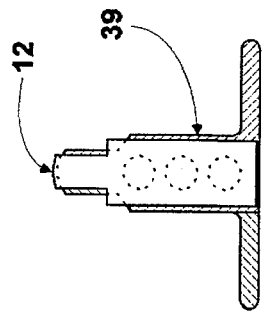
*Figure 6C*
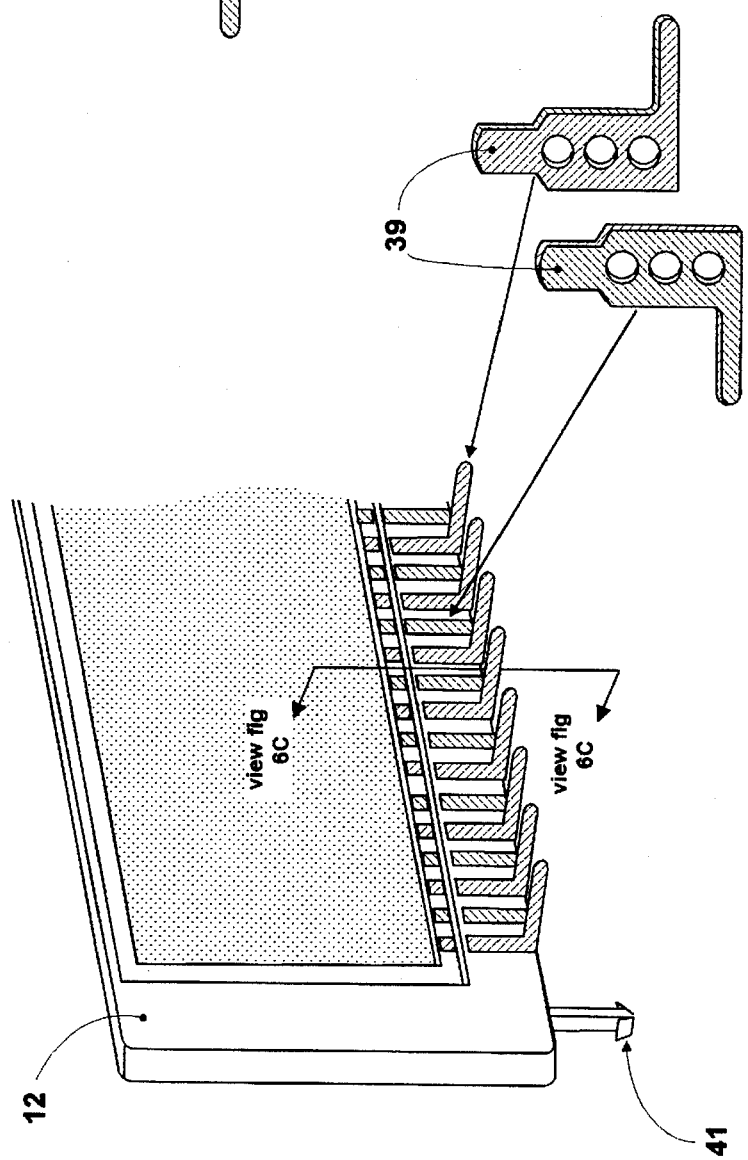
*Figure 6B*
*Figure 6A*
*Figure 6*

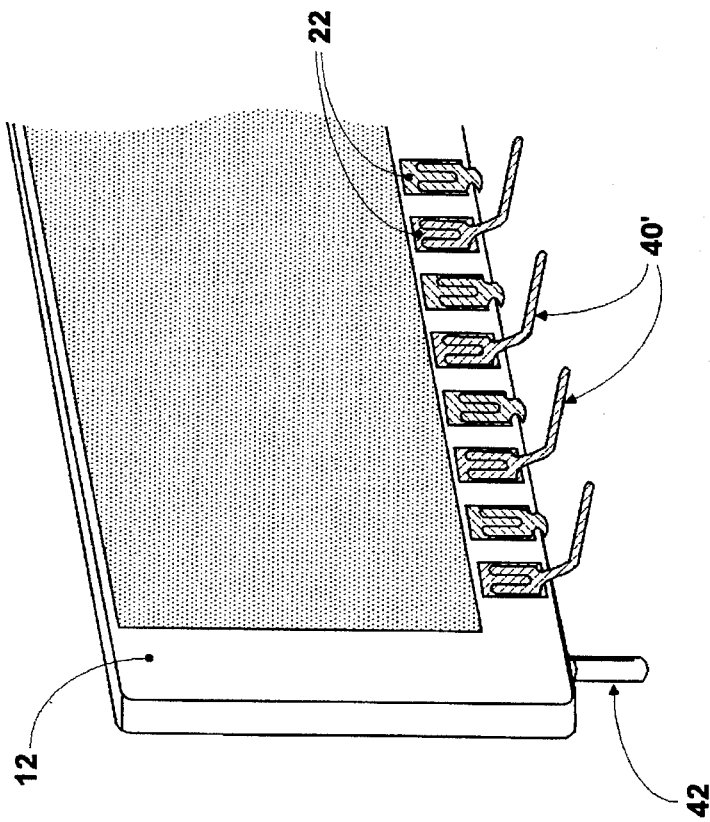
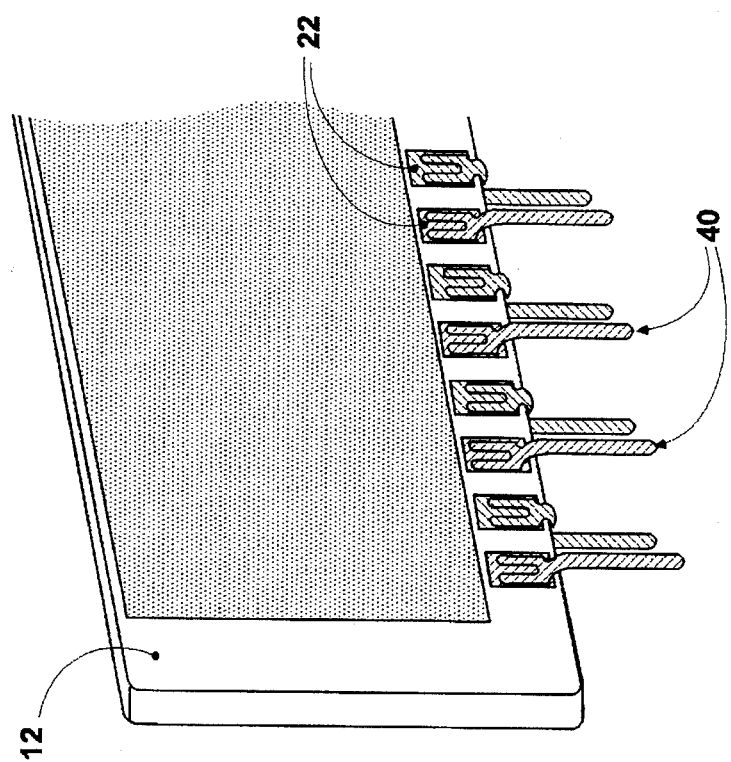

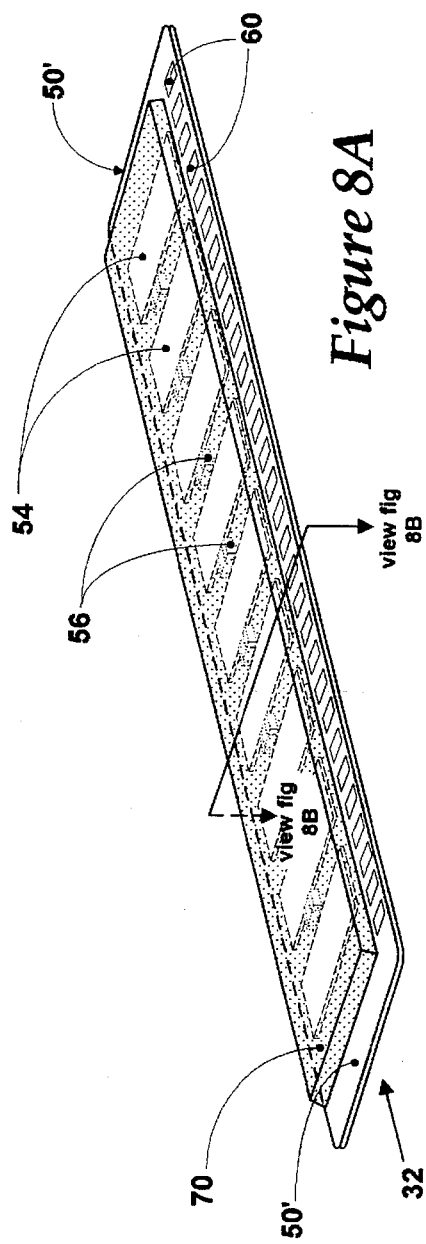
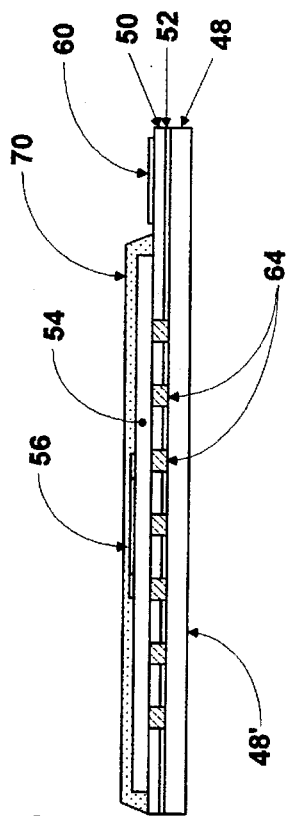
Figure 8A
Figure 8B
Figure 8

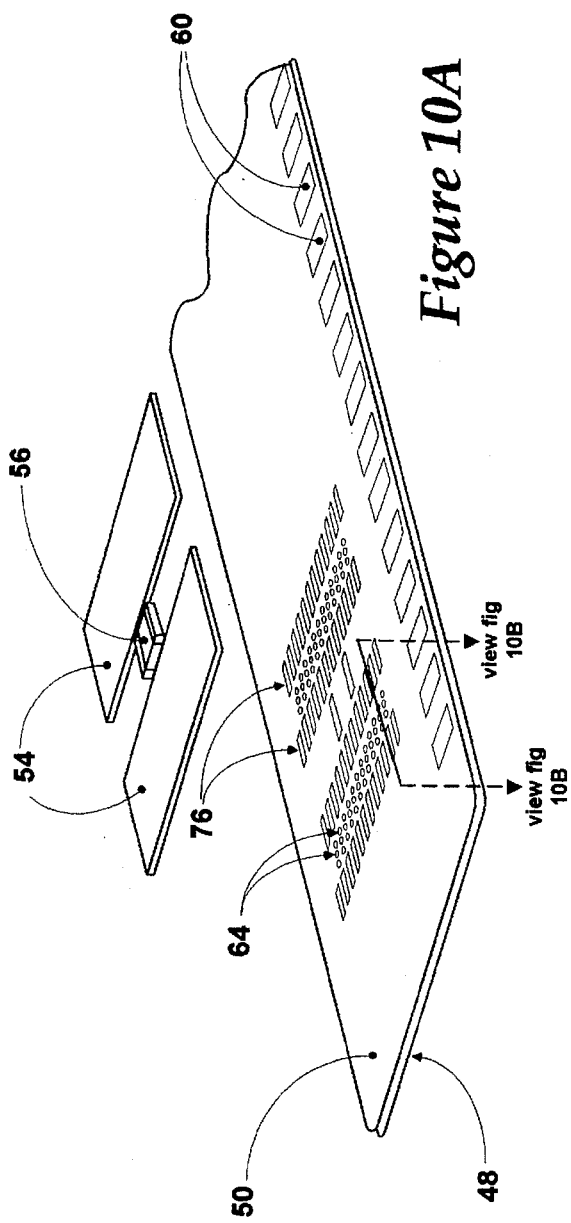
*Figure 10A*
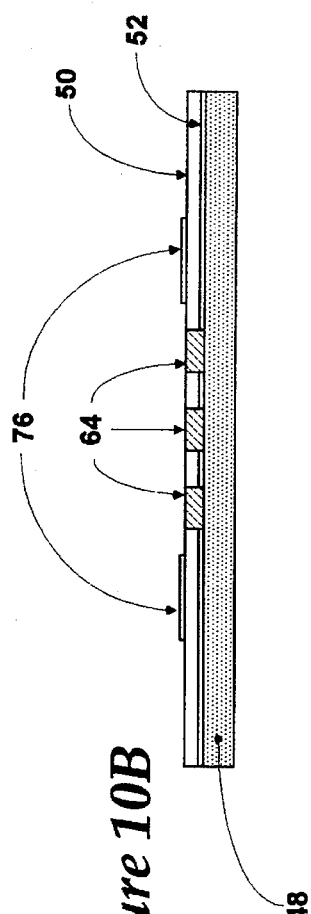
*Figure 10B*
*Figure 10*

THIN MULTICHIP MODULE

This is a continuation of application Ser. No. 07/947,293 filed on Sep. 16, 1992, abandoned.

FIELD OF INVENTION

The present invention relates generally to means for encapsulating microelectronic devices. More specifically, the present invention provides an improved module for significantly increasing the packaging density of microelectronic components.

BACKGROUND

The electronics industry has a continuing goal of increasing component packaging density in an effort to obtain increased functionality and consequent performance in smaller volumetric size. The principal roadblocks in meeting this goal have been the lack of industry standards for form factors and a flexible design which can be adapted to differing device types. Another significant impediment to increased packaging density has been the lack of a efficient means for dissipation of thermal energy generated by the devices.

One of the largest microelectronic device module markets is that related to dynamic random access memories (DRAM's). Since its introduction in 1983, the Single In-Line Memory Module or SIMM, disclosed generally in U.S. Pat. Nos. 4,656,605 and 4,727,513, has grown to become the preferred module configuration for the DRAM semiconductor market. Among the advantages offered by the SIMM are the following: (1) its significant packaging density increase achieved over prior chip mounting configurations, (2) the convenience for modular replacement or upgrade, and (3) availability of multiple, low-cost manufacturing sources.

A continuing industry trend towards increasing performance and smaller size, however, foreshadows the need for an even more compact module than the present SIMM is able to provide. The quest for ever faster data processing and more compact, light weight, portable electronic products necessitates newer semiconductor packaging schemes that enable aggregate assemblages of bare silicon devices to be interconnected together and mechanically protected inside a thin, lightweight module. Because of the handling difficulty and expense associated with repairing or replacing bare silicon chip devices, there is a need for an improved multichip module which meets the need for increased packaging density while maintaining minimum expense. This present invention, described in greater detail below, seeks to satisfy this need within the electronic industry.

Though semiconductor memory devices occupy the vast majority of the module market today, there is also a growing requirement to modularize other semiconductor components including, but not limited to, microprocessor, application specific integrated circuits, telecommunication and other device types. Accordingly, the present invention provides an upgrade path for a greater number of interconnect pins/pads and improves the thermal dissipation characteristics over present day microelectronic device modules.

SUMMARY OF THE INVENTION

The improved semiconductor module of the present invention is broadly comprised of a molded frame and a composite semiconductor substrate subassembly received in a cavity in said frame. The composite semiconductor substrate subassembly comprises a plurality of semiconductor devices which are connected to electrical contacts on an edge of the molded frame by a variety of configurations described herein.

In one embodiment of the invention, the composite semiconductor substrate subassembly includes a composite substrate which comprises a thin metal cover plate and thin laminate circuit which is bonded to the metal cover plate by a film adhesive. The composite substrate provides a mounting surface for the placement of semiconductor devices and their associated passive components. In some of the embodiments disclosed herein, the composite semiconductor substrate sub-assembly, comprising a cover plate with the composite substrate attached thereto, is attached to the molded frame by a rectangular ring formed from an anisotropic, electrically conductive adhesive material. The composite substrate employed in the present invention offers the advantage of allowing the components to be pre-assembled, tested and repaired prior to final attachment into the molded frame.

BRIEF DESCRIPTION OF THE DRAWINGS

FIGS. 2A–2B are, cross-sectional views taken along lines 2A—2A of FIG. 1 showing details relating to electrical contacts of the molded frame of the present invention.

FIG. 3 is a detailed view of the electrical contacts of the molded frame of the present invention.

FIGS. 4A–4D show details relating to individual contact elements employed in the multi-chip module of the present invention.

FIGS. 5A–5C show details relating to alternate embodiments of individual contact elements employed in the multi-chip module of the present invention.

FIGS. 6A–6C show details relating to further alternate embodiments of individual contact elements employed in the multi-chip module of the present invention.

FIGS. 7A–7B show alternate embodiments of edge mount clips for electrical contacts on the molded frame of the present invention FIGS. 8A–8B illustrate an alternate embodiment of the present invention comprising an overmolded composite semiconductor substrate assembly.

FIGS. 10A–10B illustrate thermal dissipation features of the composite semiconductor substrate of the present invention.

DETAILED DESCRIPTION OF THE PREFERRED EMBODIMENT

A preferred embodiment of the. multichip module 10 of the present invention can be understood by referring to FIG.

1, which is an exploded view of the major components of the module. A molded frame assembly 12 comprises an internal cavity 14 which extends over a substantial portion of the length and width of the module to provide a nesting area for the electronic components in the finished module assembly. The molded frame 12 can be manufactured from an injection molded, thermoplastic material such as a liquid crystal polymer (LPC) or "Ryton™". Both of these materials allow consistent and repeatable control over the dimensions of the molded frame 12. However, it should be obvious to one versed in the art, that several other materials may be substitute without departing from the scope or spirit of this invention. For example, the molded frame 12 may also be constructed from single or multiple laminate layers of epoxy glass materials (similar in composition to conventional PCB products) which have been shaped by stamping, pressing or machining processes to produce features similar in function to those described above. Alternatively, the molded frame 12 may be formed from one of several ceramic based materials processed though a firing kiln or hydraulic press by techniques well known within the industry.

Figure 1:
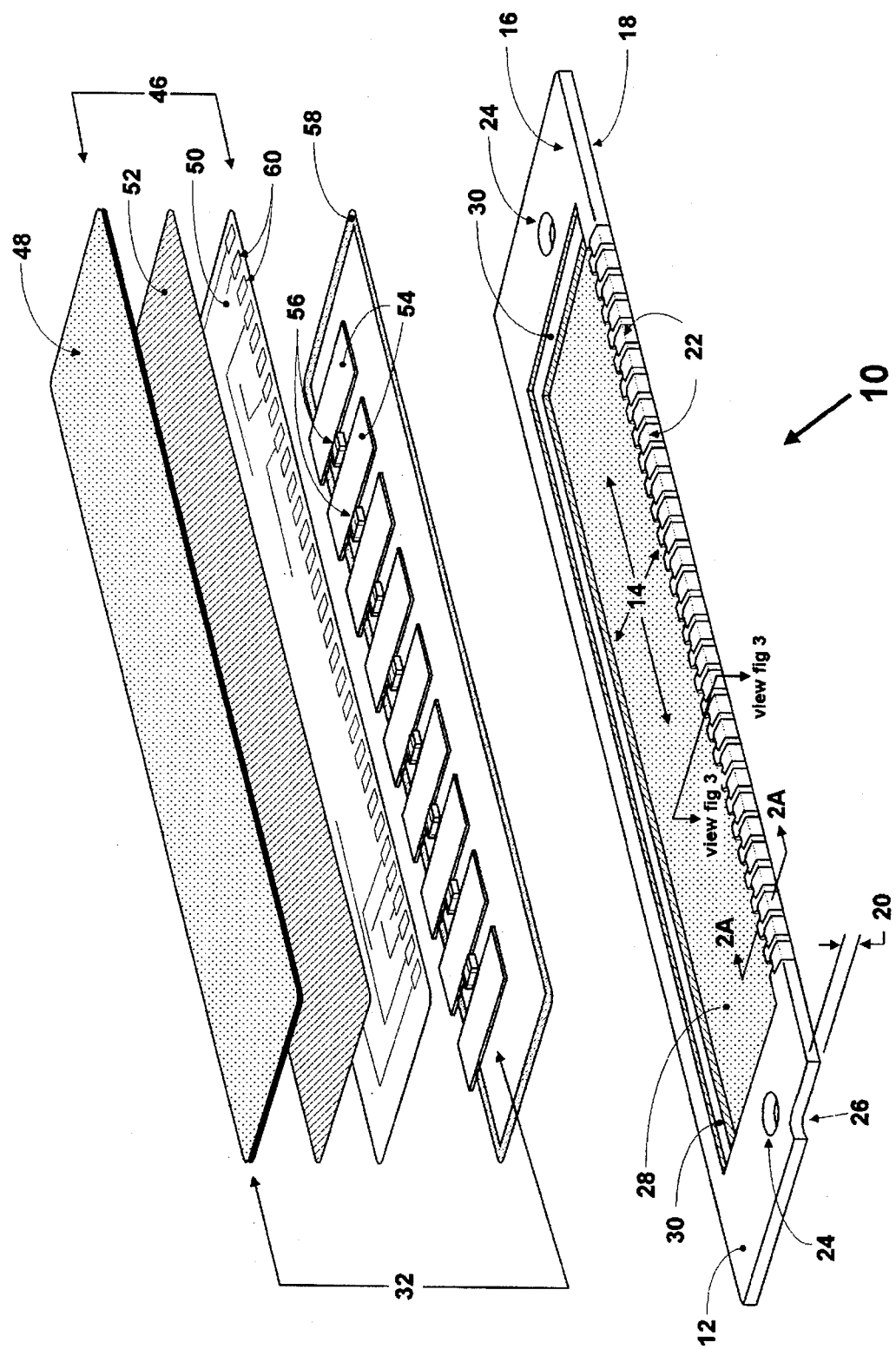
FIG. 1 is a exploded view of the major components of a first embodiment of the thin multichip module of the present invention.

Referring to FIG. 1 it can be seen that the molded frame 12 comprises first and second major parallel planes, illustrated by reference numerals 16 and 18, respectively, that are separated by a specified edge thickness illustrated by reference numeral 20. An array of contact pads 22 along one edge of the frame 12 provides electrical connection between the semiconductor devices contained within the interior of the module and an appropriate mating socket. In the embodiment illustrated in FIG. 1, the frame 12 is provided with two optional end holes 24 and a corner notch 26. These features are used for proper mating of the module to presently available SIMM sockets supplied by several connector manufacturers.

The internal cavity 14 may extend either partially or completely through the edge thickness 20, depending upon the spacing requirements of the components contained in the module. Although it is possible to construct the frame to have a single internal cavity, it is possible to also create first and second internal cavities by forming a thin, integrally molded floor 28 positioned along the centerline of the module thickness. Two possible embodiments of the molded floor 28 are illustrated in FIGS. 2A and 2B. In FIG. 2A, which is taken along section lines 2A-2A of FIG. 1, the floor 28 is shown molded flush to the second major plane 18. In the embodiment illustrated in FIG. 2B, however, the floor 28 is shown along the centerline of the module thickness to form first and second internal cavities in the interior of the module.

A stepped ledge 30 is formed around the circumference of the cavity 14 or cavities to provide a receiving area for the mating composite semiconductor substrate assembly 32 described in greater detail below. In the preferred embodiment, the ledge 30 is recessed below either the first major plane 16 or the second major plane 18 such that after the cover plate subassembly 32 is positioned and sealed in place, the outer surfaces of the subassembly 32 and the molded frame 12 are substantially flush to one another. Alternatively, the ledges may be simple extensions of major plane 16 and/or major plane 18, as illustrated in FIG. 2B, placing the composite semiconductor substrate assembly 32 further away from the center line of the module thickness, thus allowing more spacing for internal components. In this embodiment, the cover plate sub-assembly 32 would project a short distance above major plane 16 and/or major plane 18.

The array of contact pads 22 on the edge of the molded frame 12 provide electrical connection from the external surface edge of the module to an interior stepped ledge 30 of the module cavity 14 or cavities. Arrayed across the interior stepped ledge 30 is a multiplicity of smaller termination pads 34, each electrically paired with an associated external contact pad 22. In one embodiment of the invention, each of the contact pads 22 and termination pads 34 are formed by a selective plating process that deposits a conductive metal pattern extending from the edge of the molded frame 12, across the surface of the frame, and down a vertical wall or inclined plane 36, as shown in FIG. 2A and 3, to the surface of the ledge 30 lying a short distance below the first major plane 16 and/or the second major plane 18. Similarly positioned pairs of contact pads 22 and termination pads 34 on the opposite planes of the molded frame 12 can be electrically connected by a shunt 21 across the lower edge of the frame 12, as illustrated in FIG. 2B, or left electrically isolated.

Post molded plating techniques that may be commonly employed to produce the multi-leveled path of electrical conduction include, but are not restricted to, electrolytic or electroless plated copper, nickel, gold, or tin/lead alloys. These and other pure metals and alloys may be selectively plated onto the selected portions of the molded frame 12 via surface treatment and masking techniques known and available within the molded PCB industry. Alternatively, various plating processes may be employed separately or combined with screen printable, metal filled inks to produce electrically conductive pads on ceramic or epoxy glass materials.

As the need arises for a greater number of signal and data in/out connections than can be accommodated by using conventional plating processes to reduce the contact pad-width 23 and contact-to-contact pad-pitch 25, as shown in FIG. 3, an increased signal path density can be obtained by integrally molding into frame 12 an array of stamped metal contacts or by inserting stamped metal contacts into receptacles pre-molded in the edge of the frame 12, as shown in FIG. 4D. The array of stamped metal contacts comprises a plurality of thin, substantially parallel plates that are closely spaced but electrically insulated from one another by encompassing mold material. These stamped metal contacts have exposed edges extending from the bottom edge of the molded frame 12 across the contact pad surface plane and across the interior stepped ledge on the interior of the frame. The edges of the stamped contacts are substantially flush with the surrounding molded surfaces or project slightly above, except in the area corresponding to the exposed edge of the composite semiconductor substrate sub-assembly 32 where the stamped contact would be recessed into the molded frame to avoid undesirable electrical contact and structural weakening of the molded frame.

The above-described electrical contact arrangement can be understood by referring to FIGS. 4A-4C. FIG. 4A is an illustration of an array 36 of individual contact members 38. The edges of the individual contacts 38 provide electrical interconnections between the interior and exterior of the frame 12 corresponding to the contact pads 22 and termination pads 34 discussed above. For example, once the array 36 of contacts 38 have been molded or inserted into the edge of the frame 12, as illustrated in FIGS. 4A and 4C, the edges 22' and 34' of the individual contacts 38, shown in FIGS. 4A and 4C, correspond to the respective contact pads 22 and termination pads 34 discussed above in connection with the prior embodiments. FIG. 4C is a cross-sectional illustration of the contacts positioned inside frame 12. This figure also illustrates an additional electrical contact surface resulting from the projection of an end portion 22" of a contact 38 from the edge of the frame 12.

Additional embodiments based on the concept of integrally molded or insertable individual contact members 38 as an array 36 can be seen in FIGS. 5 and 6. Since individual contact members 38 are formed by a stamping process, which does not necessitate additional bending or folding steps to form the contacts, simple appendages may be optionally included during stamping of the contacts to customize the contacts for a "through hole" leaded contact 37 or a "surface mount" leaded contact 39. Adjusting the centerline of the "through hole" lead 37' enables the distance, D, between the adjacent contacts 37 to be adjusted (D') for standard or non-standard hole patterns on the main circuit board as illustrated in FIGS. 5B and C, when adjacent contacts in an array are molded or inserted while alternately rotated 180 degrees with respect to each other. By molding or inserting "surface mount" leaded contacts 39 in alternating orientations as illustrated in FIGS. 6B and 6C, solder pads on the main circuit board may be optimally spaced on alternating sides of the module, and a more stable mounting base is provided with contacts 39. Additional support may be provided at both ends of the molded frame 12, as later described in connection with FIG. 7 B, by inserting or molding a formed metal clip or post 41 into the bottom-end of molded frame 12.

Use of flat surfaced contact pads 22 located at the bottom edge of the molded frame 12 is the preferred configuration for this invention for backward compatibility with present SIMM sockets. However, an alternative embodiment of the invention would include formed metal clips over the edge of the molded frame to produce a "leaded" version of the invention for direct solder mounting of the module to a PCB using either "through-hole" or "surface mount" soldering technology. FIG. 7A is an illustration of the molded frame 12 having a plurality of leads 40 attached to the contact pads 22 for use on a "through hole" soldering attachment. FIG. 7B is an illustration of plurality of leads 40' attached to the contact pads 22 for use in a "surface mount" soldering attachment. In this embodiment of the invention, an end post 42 integrally molded at both extreme ends on the molded frame 12 is included to assist in maintaining proper alignment of the module in the main circuit board during the "surface mount" soldering process. These end posts 42 would typically be molded with differing cross-sectional diameters, i.e., one larger than the other, to mate with appropriately sized holes within the main circuit board, thereby enabling the modules to be correctly oriented and secured against movement during the soldering process.

Details relating to the composite semiconductor substrate sub-assembly 32 will now be discussed by referring again to FIG. 1. The sub-assembly includes a composite substrate 46 which comprises a thin metal cover plate 48 and thin laminate circuit 50 which is bonded to the metal cover plate 48 by a film adhesive 52. The composite substrate 46 provides a rigid mounting surface for the placement of semiconductor devices 54 and their associated passive components 56. The composite semiconductor substrate sub-assembly 32 is attached to the molded frame by a rectangular ring 58 formed from an anisotropic, electrically conductive adhesive material.

The composite substrate employed in the present invention offers the advantage of allowing the components to be pre-assembled, tested and repaired prior to final attachment into the molded frame 12. In the preferred embodiment, the cover plate 48 is formed from stainless steel and the thin laminate circuit 50 is a multilayered, thin copper/polyimide flexible circuit. However, materials other than those described above can be substituted for the cover plate 48 and the thin laminate circuit 50. Alternative material choices for the cover plate 48 include epoxy-glass, ceramic, aluminum, copper-nickel alloys and other metal and non-metal rigid structures. The metal materials listed above offer advantages over other material choices, because of their thermal transfer properties. Anti-static and/or electrical shielding properties are also enhanced by the use of a metal cover plate 48. Additional anti-static protection in selective locations may be provided by including anti-static or electrically conductive filler materials in the mold compound when forming the molded frame 12 and/or adding specialized coatings as part of a post molded process. These extra measures would be warranted for static sensitive or electrically emissive semiconductor devices. In applications involving semiconductor devices switching or operating at frequencies above 50 Mhz., it may be necessary or desirable to establish an electrical ground plane potential across the cover plate 48. This may be readily accomplished by direct electrical contact between one or more specific ground contact pads 22 and the cover plate 48, or through ground connections established directly through the thin laminate circuit 50.

Numerous materials may be substituted for the thin laminate circuit 50 without departing from the scope or spirit of the present invention. For instance, thin epoxy-glass PCBs, multi-layer ceramic circuit cards, screen printed or vacuum deposited and/or plated thin film chrome/copper/gold or aluminum, over polyimide or polyester film circuits may each be effectively used in place of the preferred flexible circuit. In some instances, a film adhesive 52 may not be required. For example, a thin laminate circuit 50 fabricated by sequential deposition of copper/polyimide thin films directly onto the cover plate 48 would not require an adhesive. This type of process is generally associated with controlled or matched impedance circuits employing stripline and/or wave guide structures required for high frequency applications.

The primary purpose of the thin laminate circuit 50 is to provide electrical interconnection between individual electronic devices 54 or a group of stacked electronic devices mounted on the circuit 50, and to conduct data signals and control voltages to and from the termination pads 34 on the molded frame 12. To facilitate transfer of these signals and voltages, a series of electrically conductive substrate pads 60 are arrayed along one or more edges of the thin laminate circuit 50 such that when the composite semiconductor substrate sub-assembly 32 is attached to the molded frame 12, each substrate pad 60 overlays a corresponding termination pad 34 on the molded frame 12.

In an alternate embodiment of the present invention, the thin laminate circuit 50 can be attached on or integrated directly into the floor 28 of the molded frame 12. In this embodiment, the cover plate 48 may include an additional thin laminate circuit. Tab leads or pads arrayed along the edge(s) of the circuit 50 can then be directly connected or soldered to appropriately sized and placed termination pads 34 along a shorter stepped ledge 30 or floor 28 of the molded frame 12. Another embodiment, —principally suitable for a molded frame 12 formed from multiple, stacked, layers of kiln-fired, ceramic sheets imprinted with electrically conductive lines and via pads,—can incorporate the circuit as an integral part of the floor 28 of the module frame 12, such that the uppermost layer constituted the device and component attachment surface. In yet another embodiment of the present invention, the composite semiconductor substrate sub-assembly 32 can be used independently of the molded frame 12 by applying or molding a protective overcoat 70, as shown in FIG. 8, comprising an epoxy or mold compound material covering the semiconductor devices 54, passive components 56 and substantial surface of the thin laminate circuit 50, leaving substrate pads 60, end surfaces 50' and external surface 48' of the cover plate 48 exposed. The resultant composite semiconductor substrate subassembly 32 can then be mated to an appropriate socket with slots to receive the end surfaces 50' or combined with a plurality of leads 40 for directly mounting to a main circuit board. An optional embodiment of the module shown in FIG. 8 can combine additional semiconductor devices 54 and other components 56 to the external surface 48' of the cover plate 48 by applying an additional thin laminate circuit 50 and applying or molding a protective overcoat 70 to the surface 48' also. Thin laminate circuits 50 on either surface of cover plate 48 can be either physically separate and, therefore, electrically independent, or physically and electrically joined along the edge(s) of cover plate 48 as a single flexible circuit folded over and around said edge(s). In this example, the module would appear symmetrical with respect to a centerline drawn end-to-end through cover plate 48, as shown in FIG. 8B.

Figure 9:
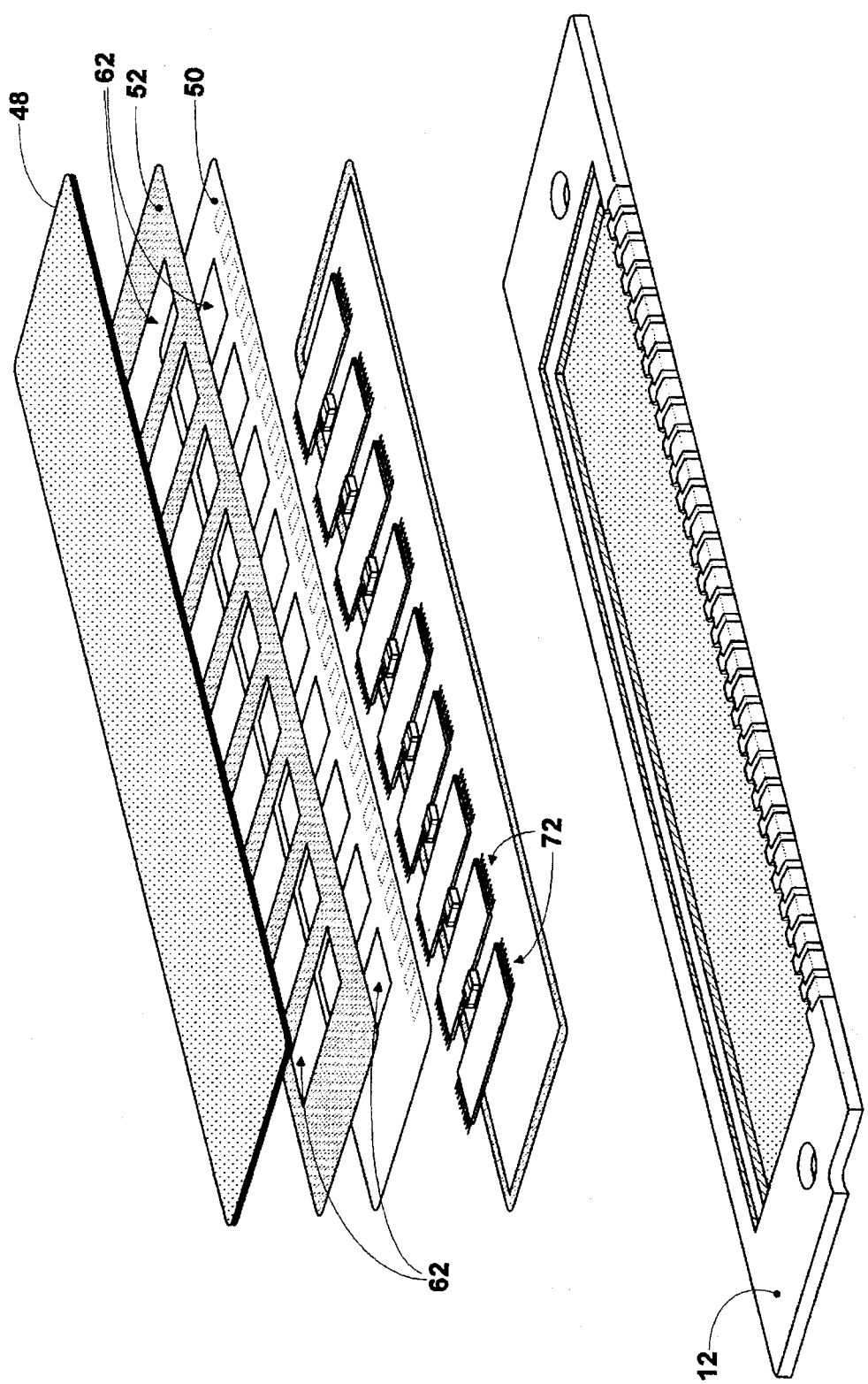
FIG. 9 is a exploded view of the major components of an alternate embodiment of the thin multichip module of the present invention.
Figure 11:
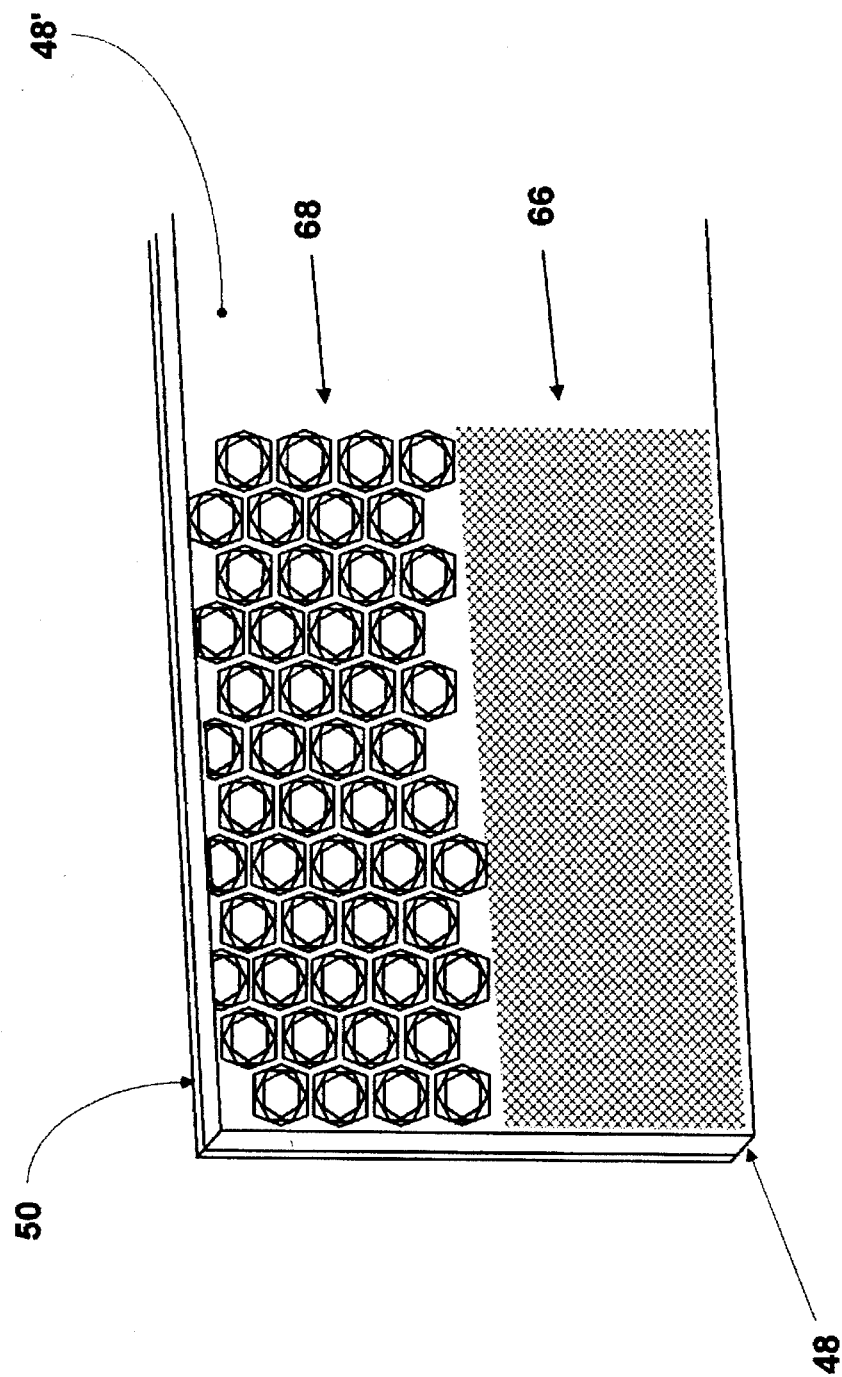
FIG. 11 illustrates thermal dissipation features of the cover plate of the composite semiconductor substrate of the present invention.

To lower thermal resistance and, hence, enhance normal thermal conductivity between the contained semiconductor devices and the exterior surface of the module, several features may be optionally incorporated as part of the thin laminate circuit 50. Maximum thermal conduction may be achieved by incorporating open windows 62 within the thin laminate circuit 50 and if present, adhesive 52, to allow backside chip attachment directly to the cover plate 48, as shown in FIG. 9. Chip attachment can be accomplished using eutectic alloying materials (e.g., solder), metal filled epoxy or other thermally conductive adhesives. This technique would preferably be performed on a cover plate 48 formed from material exhibiting the same or approximate coefficient of thermal expansion as the chip devices attached thereon to promote better mechanical reliability of the attachment bondline. An alternative approach to lower thermal resistance makes use of small thermal vies 64 formed as an integral part of the thin laminate circuit 50. Strategically arrayed under selective chip mounting sites, as shown in FIG. 10A, these structures provided either solid conductive posts or small openings through the circuit 50 and adhesives 52, into which a thermally conductive material may be emplaced, bringing intimate thermal, metal-to-silicon, contact between the cover plate 48 and semiconductor device 54 at localized areas beneath semiconductor devices 54. Another enhancement of thermal convection, or transfer of heat into the ambient air surrounding the module, involves the incorporation into the external surface 48' of the cover plate 48, a surface finish 66 or uniform array of small polygon structures 68 impressed into the surface, for the purpose of increasing the total external surface area of the cover plate 48, as shown in FIG. 11.

Electrical and mechanical mating between the composite semiconductor substrate subassembly 32 and the molded frame 12 is accomplished by one of several methods. In the preferred embodiment, an anisotropic, electrically conductive, adhesive film 58—available from several manufacturers—is pro-positioned as either a preform or pre-dispensed, stenciled or transfer stamped in liquid form and dried in place on either the composite semiconductor substrate subassembly 32 or molded frame 12, and subsequently activated by thermal and/or pressure contact in accordance with the manufacturer's instructions. Alternatively, a solderable alloy combined with a thermal setting adhesive may be selectively applied around the ledge 30 and across the pads 34 and thermally activated to effect both a mechanical and electrical interconnect. Yet another material that may be substituted is commonly referred to as a 'z-axis elastomeric conductor', which may be fashioned from a material with adhesive properties to effect simultaneous mechanical and electrical attachment between the composite semiconductor substrate subassembly 32 and the molded frame 12.

Figure 12:
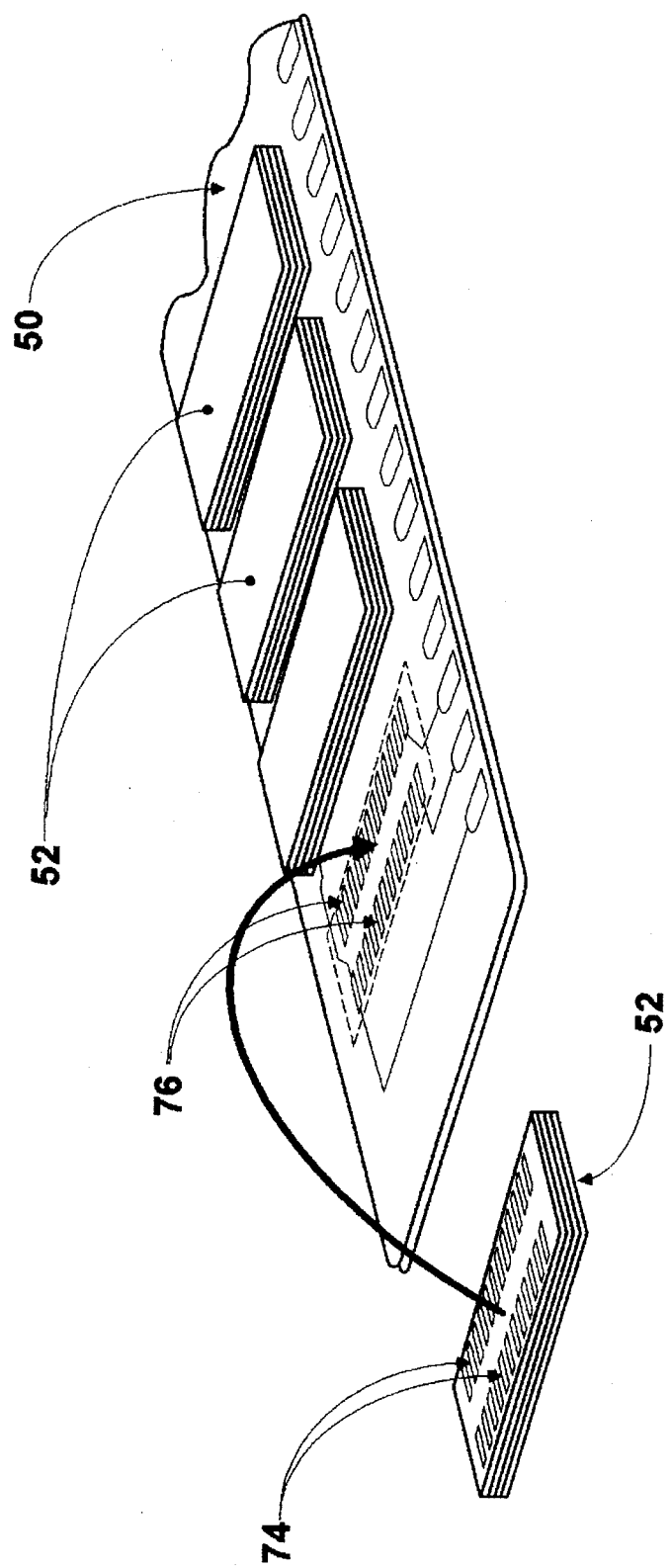
FIG. 12 illustrates an implementation of stacked memory chips for use in the composite semiconductor substrate assembly of the present invention.

Semiconductor device attachment to the thin laminate circuit 50 is achieved by one of several methods commonly known and available with the industry. Tape Automated Bonding (TAB) technology provides a network of tab leads 72 attached to metallurgical bumps on specific device bondpads, which are elevated from the surface and which extend beyond the perimeter of the silicon device, as shown in FIG. 9. The free ends of the tab leads may be mechanically/electrically bonded to appropriately spaced and metallurgically compatible bond sites on the laminate circuit 50 with the silicon device(s) configured in either a face-up or face-down configuration. Alternatively, the device may be attached using 'Chip On Board' (COB) technology where the chip is mounted with an epoxy paste or solder alloy in a face-up orientation, and electrically connected to the laminate circuit 50 with conventional wire-bonds. Yet another, and preferred technique, shown in FIGS. 10 and 12, is known as Flip Chip Assembly or Direct Chip Attach (DCA). In this example, suitably sized bond pads 74 on the face of the chip(s) are directly attached to matching pads 76 on the laminated circuit 50 with one of several techniques and materials. Examples include 'Controlled Collapse Chip Connection' ("C4") soldering technology developed and licensed by IBM, conductive epoxies, solder-ball reflow, and anisotropic conductive adhesives. Typically this chip mounting methodology is combined with specific chip undercoating materials to enhance mechanical reliability, hermeticity and/or thermal conductivity.

A variety of semiconductor devices may be readily assembled into the module of the present invention by careful tailoring of the molded frame 12 and the composite semiconductor substrate subassembly 32. Typical devices include, but are not limited to, Memory chips (DRAM, AS-DRAMs, Flash-EEprom, ROM, Fast/Slow-Static RAMs, Ferro-magnetic RAM, et. al.), Microprocessor, Application Specific IC's, Gate Array devices, Telecommunication IC's and others manufactured in CMOS, BiCMOS, and other technologies compatible with TTL, ECL, FAST and other logic interface standards. Since DRAM and other memory device types are generally used in large quantities in typical computing applications and require a proportionately large share of the volumetric mounting capacity available, it is expected that these devices will predominate in this invention. A significant performance and density gain may be achieved by combining this invention with stacked memory chips 52, shown in FIG. 12, supplied by Ervine Sensors Corp. of Costa Mesa, Calif. These stacked chips are pre-processed through a back-lapping operation to substantially reduce their individual thickness, and are subsequently bonded together to form short, vertical, interconnected, 3-D stacks that may then be directly face-bonded (DCA or Flip Chip mounted) to the thin laminate circuit 50 as described above. This technique may be warranted for computationally intensive or space limited applications. In addition to the variety of semiconductor devices that may find application in this invention, associated passive electronic components 56, including chip capacitors, resistors, etc., may also be surface mount soldered onto the thin laminate circuit. Chip de coupling capacitors are used in particular with memory devices to function in the suppression of spurious voltage spikes when electrically connected between a net positive or negative voltage reference and electrical ground. For most applications, these passive components are expected to stand slightly above the mounted height of the adjacent semiconductor devices, as shown in FIG. 8B. Since these components are generally composed of a robust ceramic material, they may be advantageously employed to prevent direct pressure from being applied against the fragile semiconductor devices should the assembled module be compressed in an axis perpendicular to the first major plane 16 and/or the second major plane 18 of molded frame 12. Alternatively, special raised stand-off features may be integrally molded into the floor 28 of the molded frame 12, surrounding the areas reserved for the semiconductor devices, to prevent damage resulting from compressional forces.

In its final form, the composite semiconductor substrate sub-assembly 32 total thickness, including semiconductor devices and passive components, would generally range from 0.010–0.040 inches in order to fit within the present 0.050-inch standard SIMM module thickness specification. However, in other applications, the total thickness may be appropriately increased to provide additional space for the mounted devices and components.

Figure 13:
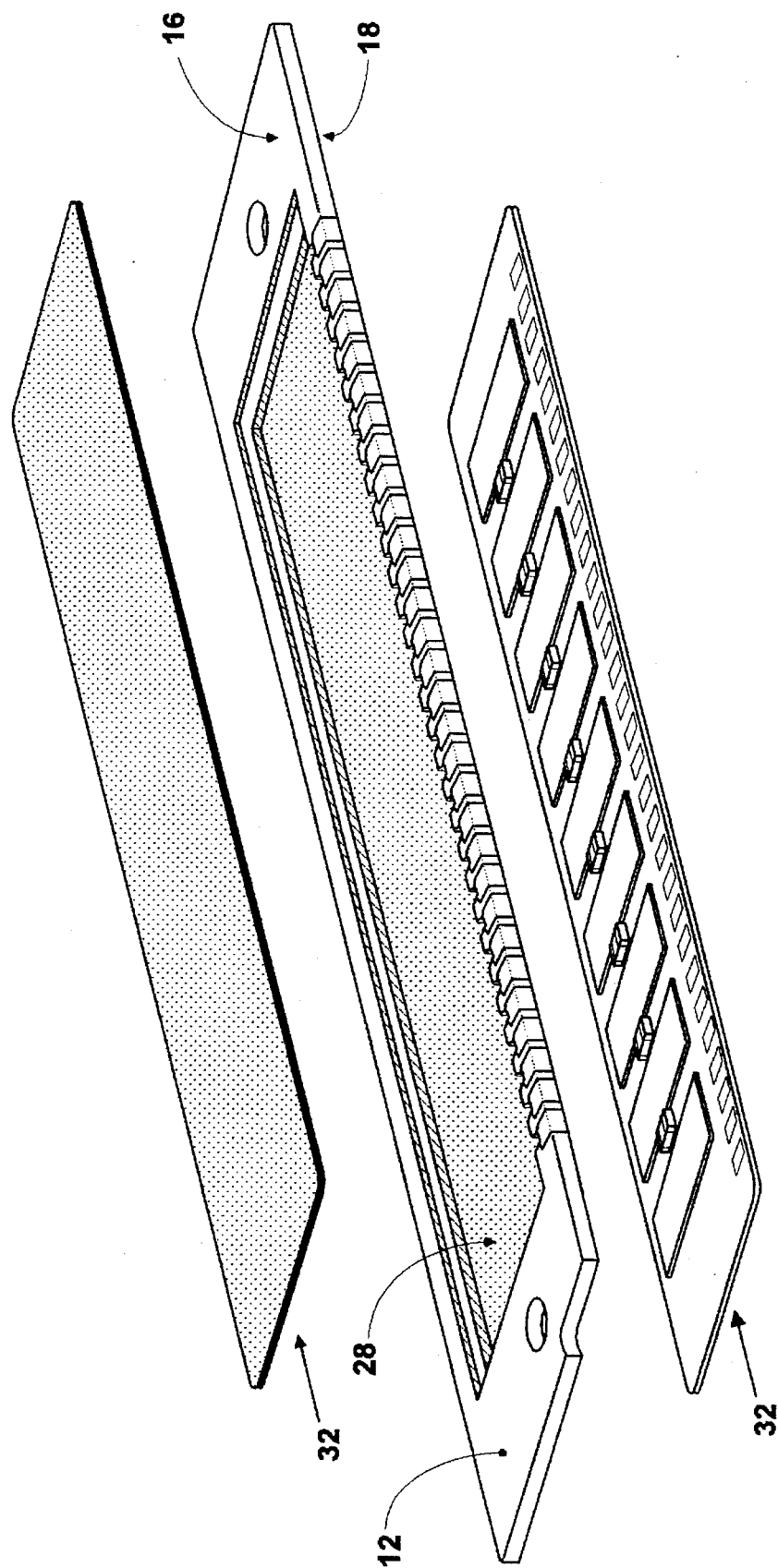
FIG. 13 is a exploded view of the major components of an alternate embodiment of the thin multichip module of the present invention comprising multiple composite semiconductor substrate assemblies.

In instances where two composite semiconductor substrate subassemblies 32 are attached to the molded frame 12, as shown in FIG. 13,—one in the first major plane and another in the second major plane, the floor 28 can be hollowed or eliminated to increase the available spacing between mounted devices and components. (Substrate-to-substrate electrical interconnect is normally provided via electrical shunting of the contact pads 22 across the bottom edge 20 of the molded frame 12. However, additional interconnections may be facilitated around the entire perimeter of the internal stepped ledge 30 or edge of molded frame 12 opposite contacts 22 (top edge of frame), similar to contacts 22.) In this embodiment, signal communication between opposite and opposing composite subassemblies 32 can be established via light emitting/receiving, point-to-point data/signal communication across the narrow air gap between juxtaposed semiconductor devices—accurately positioned to face one another—thereby eliminating the necessity for long crossover electrical paths through the thin laminate circuits 50 and across the stepped ledge 30 or edges 20. Since it is expected that semiconductor or other electronic devices employing light emitting/receiving structures on their respective surfaces or edges may eventually become a practical alternative for chip-to-chip communication, this invention may become the preferred multichip package for shielding these components in a compact, "light safe" enclosure.

Yet another alternate embodiment of the present invention includes the injection or dispensing of a semi-rigid compound or elastomeric material to fill all or part of the volumetric void between adjacent composite semiconductor substrate subassemblies 32 and/or floor 28 to improve the overall rigidity and mechanical integrity of the finished assembly. This technique also improves the hermeticity or moisture resistance of the module. Additional manufacturing steps to improve hermeticity at the component or semiconductor device level include special chip surface coatings or undercoatings—depending upon device orientation and application methodology—including, but not limited to organic epoxies (ex. "Praleen"™, die undercoating adhesives, etc.), vacuum/plasma deposited ceramic or diamond coatings, moisture immobilized polyimide and other suitable materials known within the industry.

The improved multichip module of the present invention offers numerous advantages over the prior art. For example, the present invention provides a significant decrease in cross-sectional thickness and overall weight reduction for the module as a whole, thereby improving the total net packing density and making the module more appealing for light-weight portable applications. Since this invention is approximately one-third of the thickness of a standard SOJ-type SIMM, it is feasible to mount two or three times more component modules within a specified area of the circuit board as compared to the prior art. The present invention provides for mechanical protection of fragile bare silicon devices by enclosing these devices inside the module, leaving no exposed components. The exterior surfaces, therefore, are free of all obstructions which may become damaged during handling or which may inhibit the placement of printed information (ex. manufacturer's name, logo, date code, part number, patent number, bar code, etc.). Modules free of externally mounted components also simplify the design of shipping trays and facilitates robotic handling and placement at the final end-users manufacturing line. Although backward compatible with existing SIMM sockets and therefore directly replaceable with conventional SOJ-type SIMMs, this invention is also capable of mating with newer sockets—presently in development—that will mount the modules closer together.

Though semiconductor memory devices occupy the vast majority of the module market today, there is also a growing requirement to modularize other semiconductor components including, but not limited to, microprocessor, application specific integrated circuits, telecommunication and other device types. Accordingly, the present invention provides an upgrade path for a greater number of interconnect pins/pads and improves the thermal dissipation characteristics over present day microelectronic device modules.

The molded frame 12 employed in the module of the present invention offers significant improvements over prior art electronic packaging systems, including those associated with currently available SIMM memory modules which employ conventional printed circuit board (PCB) materials. A majority of SIMM connecting sockets in usage today, require the module thickness to be tightly controlled across the edge contacts, for the module-socket combination to function reliably if the module is frequently inserted and removed from the socket. Standard lamination processes used in the construction of PCB's, result in large thickness variations which are difficult to control. This variation in SIMM thickness directly effects the contact pad pressure inside the socket, and has been identified as a frequent cause of intermittent electrical failures. Current practice requires rigorous inspection procedures, adding to the material costs, in order to prevent the inclusion of "out-of-spec" SIMM substrates into the manufacturing line. Substituting a molded frame for this critical component of the module provides for more consistent dimensional control across the contact pads and eliminate the necessity for 100% inspection.

An additional benefit gained from a molded frame is the ability to mold custom features on the module housing that are presently impractical with laminate PCBs. Examples of potential molded features include special locking mechanisms designed to mate with appropriate structures on the socket, finger grips, keying mechanisms and hold fasts.

Although the method and apparatus of the present invention has been described in connection with the preferred embodiment, it is not intended to be limited to the specific form set forth herein, but on the contrary; it is intended to cover such alternatives, modifications, and equivalents, as can be reasonably included within the spirit and scope of the invention as defined by the appended claims.

What is claimed is:

1. A semiconductor module, comprising:
   a frame having a floor member defining an interior portion;
   a plurality of electrical contacts along an edge of said frame;
   a composite substrate comprising: a circuit layer, a substrate cover plate, and means for adhering said circuit layer to said substrate cover plate;
   a plurality of semiconductor devices mounted to said composite substrate to form a composite semiconductor substrate subassembly, wherein said composite substrate is attached to said frame such that at least a portion of said composite semiconductor substrate subassembly is received in said interior portion of said frame and wherein said plurality of semiconductor devices are electrically coupled together; and
   electrical connecting means for electrically connecting said semiconductor devices on said composite substrate to said electrical contacts on said edge of said frame.

2. The semiconductor module according to claim 1, said frame having a generally rectangular shape with first and second major planes, said interior portion being defined by a generally rectangular aperture.

3. The semiconductor module according to claim 1, wherein said substrate cover plate has heat dissipation properties, said substrate cover plate being in thermal communication with said semiconductor devices to conduct thermal energy therefrom.

4. The semiconductor module according to claim 1, said electrical connecting means comprising a plurality of electrically conductive pins connected to said edge of said frame.

5. A semiconductor module, comprising:
   (a) a frame having an interior portion, said interior portion being defined by an aperture;
   (b) a plurality of electrical contacts along an edge of said frame;
   (c) a composite semiconductor substrate sub-assembly including a composite substrate and a plurality of semiconductor devices mounted to said composite substrate, said composite substrate comprising:
      (i) a circuit layer comprising a plurality of circuit traces for providing electrical interconnection between said semiconductor devices;
      (ii) a substrate cover plate; and
      (iii) means for adhering said circuit layer to said substrate cover plate;
   wherein said composite substrate is connected to said frame such that at least a portion of said composite semiconductor substrate sub-assembly is received in said interior portion of said frame; and
   (d) electrical connecting means for electrically connecting said semiconductor devices on said composite semiconductor substrate sub-assembly to said electrical contacts on said edge of said frame.

6. A semiconductor carrier comprising:
   (a) a generally rectangular perimeter frame member having side portions and a floor portion forming a cavity for receiving at least a portion of a semiconductor substrate;
   (b) a plurality of electrical contacts associated with a portion of said perimeter frame member;
   (c) a semiconductor substrate sub-assembly including a composite substrate comprising a cover plate and a laminate circuit applied to the cover plate and a plurality of spaced apart semiconductor devices mounted to the composite substrate, wherein said plurality of semiconductor devices are electrically coupled together;
   (d) wherein said substrate sub-assembly is connected to said frame member such that a portion of said substrate sub-assembly is received in said cavity of the frame member but does not contact said floor portion of said cavity, and
   (e) means for electrically connecting said semiconductor devices of said substrate sub-assembly to the electrical contacts on said perimeter frame member.

7. The semiconductor module according to claim 5, further comprising:
   a heat sink in thermal communication with said semiconductor devices to conduct thermal energy therefrom.

8. The semiconductor module according to claim 1, wherein said semiconductor devices are removably mounted on said composite semiconductor substrate sub-assembly.

9. The semiconductor module according to claim 1, wherein said composite semiconductor substrate sub-assembly is removably attached to said frame.

10. The semiconductor module according to claim 1, further comprising a heat sink in thermal communication with said semiconductor devices to conduct thermal energy therefrom.

11. The semiconductor module according to claim 1, wherein said plurality of electrical contacts on said edge of said frame are adapted for insertion into a mating socket in a computer system.

12. The semiconductor module according to claim 11, wherein said plurality of semiconductor devices are memory devices.

13. The semiconductor module according to claim 1, wherein said plurality of semiconductor devices interact together to store data.

14. The semiconductor module according to claim 1, wherein said composite semiconductor substrate sub-assembly has a thickness ranging between 0.010 and 0.040 inches.

15. The semiconductor module according to claim 1, wherein said semiconductor module has a thickness of approximately 0.050 inches.

16. A semiconductor module comprising:
   a frame having a floor member defining first and second cavities on opposite sides of said floor member;
   a plurality of electrical contacts on an edge of said frame;
   a first composite substrate comprising a cover plate and a circuit layer applied to said cover plate, said composite substrate having a plurality of semiconductor devices mounted thereon, wherein said composite substrate is attached to said frame such that at least a portion of said semiconductor devices are received in said first cavity of said frame;
   a second composite substrate comprising a cover plate and a circuit layer applied to said cover plate, said composite substrate having a plurality of semiconductor devices mounted thereon, wherein said composite substrate is attached to said frame such that at least a portion of said semiconductor devices are received in said second cavity of said frame; and
   electrical connecting means for electrically connecting said semiconductor devices on said first and second composite semiconductor substrate sub-assemblies to said electrical contacts on said edge of said frame.

17. The semiconductor module of claim 16, wherein said cover plate is in thermal communication with said semiconductor devices to conduct thermal energy therefrom.

18. The module of claim 1, wherein said composite substrate includes top and bottom surfaces and said semiconductor devices are mounted to said bottom surface; and
wherein said bottom surface of said composite substrate is attached to said frame such that said bottom surface faces said interior portion of said frame.

19. The module of claim 18, wherein said bottom surface of said composite substrate is attached to said frame such that at least a portion of said semiconductor devices are received in said interior portion of said frame, wherein said semiconductor devices do not contact said interior portion of said frame.

20. The module of claim 18, wherein said top surface of said composite substrate is external to the module.

21. The module of claim 1, wherein said means affixing said cover plate to said thin laminate circuit comprises a film adhesive positioned between said cover plate and said thin laminate circuit which bonds said thin laminate circuit to said cover plate.

22. The module of claim 1, wherein said thin laminate circuit includes windows to enhance thermal conduction from said semiconductor devices to said cover plate.

23. The module of claim 1, wherein said laminate circuit includes thermal vias to enhance thermal conduction from said semiconductor devices to said cover plate.

24. The module of claim 1, wherein said frame includes a stepped ledge in said interior portion; and
wherein said means to mount said substrate subassembly to said frame mounts said substrate subassembly to said stepped ledge of said frame.

25. The module of claim 24, wherein said means to mount said substrate subassembly to said frame comprises a rectangular ring including an anisotropic, electrically conducting material which mechanically and electrically connects said composite substrate and said frame.

26. The module of claim 1, wherein said semiconductor devices include one or more stacks of semiconductor devices mounted at various locations on said composite substrate.

27. The module of claim 1, wherein said plurality of electrical contacts on said frame are adapted for mating with a single in-line memory module socket.

28. The module of claim 1, wherein said frame and said plurality of electrical contacts disposed on said frame are adapted for mating with a single in-line memory module socket.

29. A thin multichip module, comprising, in combination:
a frame defining an interior portion;
a plurality of electrical contacts disposed on said frame;
a composite substrate comprising a cover plate portion having heat dissipation capabilities, a thin laminate circuit, and means affixing said cover plate to said thin laminate circuit;
semiconductor devices mounted on said composite substrate to form a substrate subassembly, wherein said semiconductor devices are in electrical connection with said laminate circuit and in thermal proximity to said cover plate; and
mounting means for mounting said composite substrate to said frame whereby at least a portion of said substrate assembly is maintained within said interior portion of the frame and the substrate subassembly is in electrical communication with said electrical contacts on said frame.

30. The thin multichip module of claim 29, wherein said mounting means mounts said composite substrate to said frame whereby a portion of said semiconductor devices are received in, but do not contact, said interior portion of said frame.

31. A thin multichip module, comprising, in combination:
a frame defining an interior portion;
a plurality of electrical contacts disposed on said frame;
a composite substrate comprising a cover plate portion having heat dissipation capabilities and a thin laminate circuit attached to said cover plate portion, wherein said composite substrate is attached to said frame, and wherein the laminate circuit is in electrical communication with said electrical contacts on said frame;
semiconductor devices mounted on said composite substrate such that portions of said semiconductor devices are maintained within said interior portion of the frame, wherein said semiconductor devices are in electrical connection with said laminate circuit and in thermal proximity to said cover plate.

32. The thin multichip module of claim 31, wherein said semiconductor devices do not contact said interior portion of said frame.

33. A semiconductor module comprising:
a frame having a member defining first and second cavities on opposite sides of said member;
a plurality of electrical contacts on an edge of said frame;
a first composite semiconductor substrate subassembly having a plurality of semiconductor devices mounted thereon, wherein said first composite semiconductor substrate subassembly is received in said first cavity of said frame and wherein said first composite semiconductor substrate subassembly has a thickness ranging between 0.010 and 0.040 inches;
a second composite semiconductor substrate subassembly having a plurality of semiconductor devices mounted thereon, wherein said second composite semiconductor substrate subassembly is received in said second cavity of said frame and wherein said second composite semiconductor substrate subassembly has a thickness ranging between 0.010 and 0.040 inches; and
electrical connecting means for electrically connecting said semiconductor devices on said first and second composite semiconductor substrate sub-assemblies to said electrical contacts on said edge of said frame.

34. A thin multichip module, comprising, in combination:
a frame having a member defining first and second interior portions;
a plurality of electrical contacts disposed on said frame;
first and second composite substrates each comprising a cover plate portion having heat dissipation capabilities and a thin laminate circuit affixed to said cover plate portion;
semiconductor devices mounted on said first and second composite substrates to form first and second substrate subassemblies, wherein said semiconductor devices are in electrical connection with said laminate circuit and in thermal proximity to said cover plate;
first attaching means to attach said first composite substrate to said frame whereby at least a portion of said first substrate assembly is maintained within said first interior portion of the frame and the substrate subassembly is in electrical communication with said electrical contacts on said frame; and second attaching means to attach said second composite substrate to said frame whereby at least a portion of said second substrate assembly is maintained within said second interior portion of the frame and the substrate subassembly is in electrical communication with said electrical contacts on said frame.

35. The module of claim 34, wherein said semiconductor devices mounted to said first composite substrate are received in said first interior portion of said frame and wherein said semiconductor devices mounted to said second composite substrate are received in said second interior portion of said frame.

36. The module of claim 35, wherein said semiconductor devices mounted to said first and second composite substrates do not contact said member of said frame.

37. The module of claim 35, wherein said first and second composite substrates each include top and bottom surfaces, wherein said semiconductor devices are attached to said bottom surfaces of each of said first and second composite substrates, and wherein said bottom surfaces of said first and second composite substrates face said first and second interior portions, respectively.

* * * * *